US010741526B2

(12) United States Patent
Park et al.

(10) Patent No.: US 10,741,526 B2
(45) Date of Patent: Aug. 11, 2020

(54) SEMICONDUCTOR PACKAGES

(71) Applicant: Samsung Electronics Co., Ltd., Suwon-si, Gyeonggi-do (KR)

(72) Inventors: Chul Park, Seoul (KR); Seonggwan Lee, Daegu (KR); Minkyeong Park, Pyeongtaek-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 16/377,352

(22) Filed: Apr. 8, 2019

(65) Prior Publication Data

US 2019/0237432 A1  Aug. 1, 2019

Related U.S. Application Data

(63) Continuation of application No. 15/860,730, filed on Jan. 3, 2018, now Pat. No. 10,319,702.

(30) Foreign Application Priority Data

Aug. 9, 2017  (KR) .................. 10-2017-0101284

(51) Int. Cl.
    *H01L 25/065*    (2006.01)
    *H01L 25/04*     (2014.01)
    *H01L 25/07*     (2006.01)
    *H01L 25/11*     (2006.01)
    *H01L 25/075*    (2006.01)

(52) U.S. Cl.
    CPC ........ *H01L 25/0657* (2013.01); *H01L 25/043* (2013.01); *H01L 25/074* (2013.01); *H01L 25/0756* (2013.01); *H01L 25/117* (2013.01); *H01L 2224/48227* (2013.01); *H01L 2225/0651* (2013.01); *H01L 2225/06506* (2013.01); *H01L 2225/06541* (2013.01); *H01L 2225/06562* (2013.01); *H01L 2225/06582* (2013.01)

(58) Field of Classification Search
    CPC .................... H01L 25/0652; H01L 25/0756
    See application file for complete search history.

(56) References Cited

U.S. PATENT DOCUMENTS

| 7,485,955 | B2 | 2/2009 | Kang et al. |
| 8,987,053 | B2 | 3/2015 | Upadhyayula et al. |
| 9,184,147 | B2 | 11/2015 | Bae et al. |
| 9,299,685 | B2 | 3/2016 | Kim |
| 9,355,969 | B2 | 5/2016 | Park |
| 9,406,660 | B2 | 8/2016 | Ye et al. |

(Continued)

FOREIGN PATENT DOCUMENTS

| KR | 10-2011-0083969 | 7/2011 |
| KR | 10-2014-0117095 | 10/2014 |
| KR | 10-2016-0029595 | 3/2016 |

*Primary Examiner* — Farun Lu
(74) *Attorney, Agent, or Firm* — Myers Bigel, P.A.

(57) ABSTRACT

A semiconductor package includes a substrate including a signal pattern on an upper surface thereof, a chip stack on the substrate, and a first semiconductor chip and one or more spacers between the substrate and the chip stack. The chip stack includes one or more second semiconductor chips stacked on the substrate. The one or more spacers and the first semiconductor chip are adjacent to respective corners of a lowermost second semiconductor chip, in plan view. The one or more spacers have the same planar shape as the first semiconductor chip.

12 Claims, 11 Drawing Sheets

(56) References Cited

U.S. PATENT DOCUMENTS

| | | |
|---|---|---|
| 9,412,720 B2 | 8/2016 | Nam et al. |
| 2011/0037158 A1* | 2/2011 | Youn ..................... H01L 23/50 |
| | | 257/686 |
| 2011/0175222 A1 | 7/2011 | Kim et al. |
| 2013/0049228 A1* | 2/2013 | Nam ..................... H01L 24/97 |
| | | 257/777 |
| 2013/0119542 A1 | 5/2013 | Oh |

* cited by examiner

US 10,741,526 B2

SEMICONDUCTOR PACKAGES

CROSS-REFERENCE TO RELATED APPLICATION

This application is a continuation of and claims priority from U.S. application Ser. No. 15/860,730, filed on Jan. 3, 2018, which claims priority under 35 U.S.C. § 119 to Korean Patent Application No. 10-2017-0101284, filed on Aug. 9, 2017, in the Korean Intellectual Property Office, the disclosures of which are hereby incorporated herein by reference in entirety.

TECHNICAL FIELD

Example embodiments of the present disclosure relate to semiconductor packages, and, more specifically, to semiconductor packages including stacked integrated circuits.

BACKGROUND

A stack package has a structure in which a plurality of substrates are stacked. For example, the stack package may include semiconductor chips stacked on a printed circuit board (PCB). Connection pads are formed on the semiconductor chips. By connecting the connection pads with the bonding wires, the semiconductor chips may be electrically connected to each other. On the printed circuit board, a logic chip for controlling semiconductor chips may be mounted.

SUMMARY

According to some embodiments of the inventive concepts, a semiconductor package may include a substrate including a signal pattern on an upper surface thereof, a chip stack on the upper surface of the substrate, and a first semiconductor chip and one or more spacers between the substrate and the chip stack and spaced apart from each other. The chip stack may include one or more second semiconductor chips stacked on the substrate. The one or more spacers and the first semiconductor chip may be adjacent to respective corners of a lowermost second semiconductor chip, in plan view. The one or more spacers may have a same planar shape as the first semiconductor chip.

According to example embodiments of the inventive concepts, a semiconductor package may include a substrate, a first semiconductor chip on the substrate, a spacer, on the substrate, laterally spaced apart from the first semiconductor chip, second semiconductor chips stacked on the first semiconductor chip and the spacer, a first signal pad on the substrate, spaced apart from the second semiconductor chips in a first direction. The first signal pad is electrically connected to the first semiconductor chip. The semiconductor package includes a second signal pad on the substrate, that is spaced apart from the second semiconductor chips in the first direction and electrically connected to at least one of the second semiconductor chips. A first distance between the first signal pad and the second signal pad may be less than a second distance between the second signal pad and the at least one of the second semiconductor chips in the first direction.

DETAILED DESCRIPTION

Figure 1:
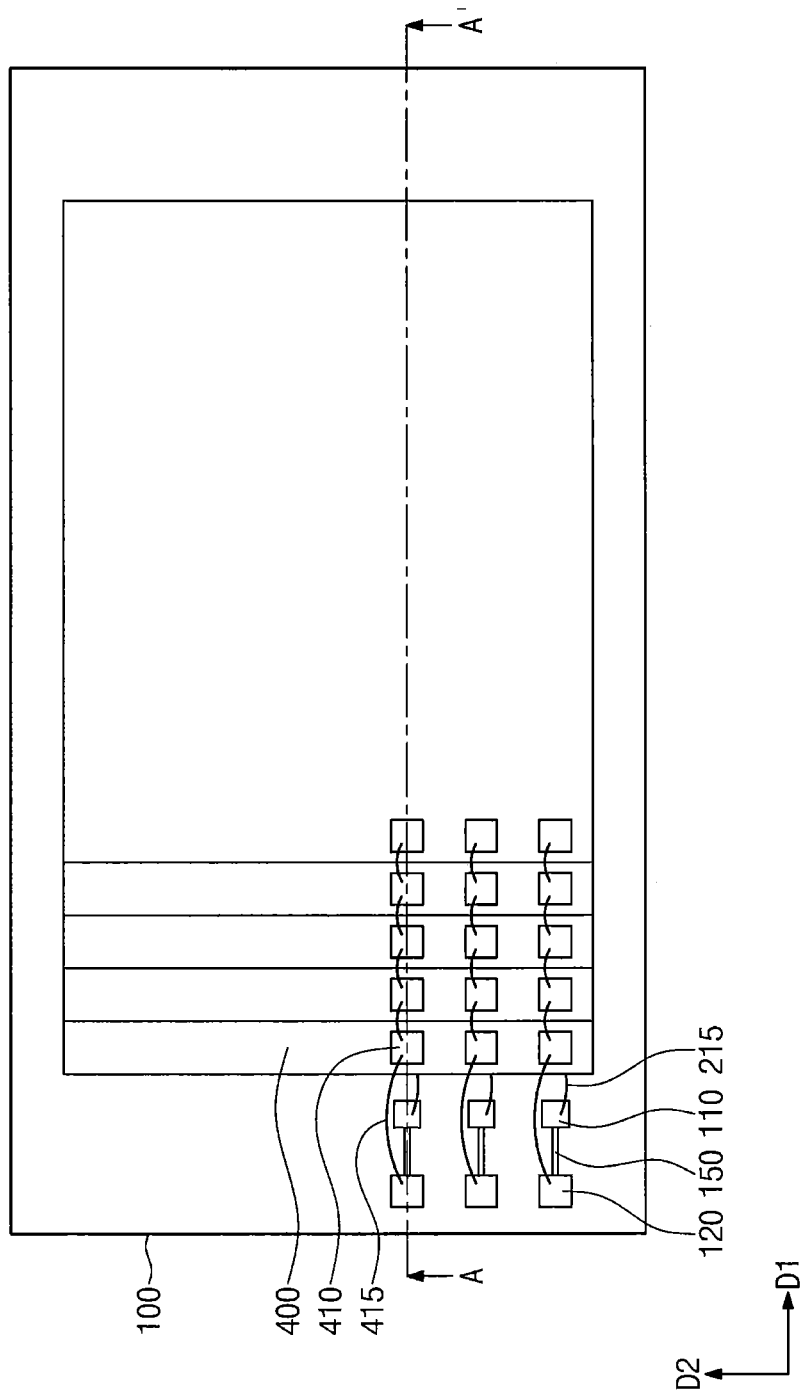
FIG. 1 is a plan view illustrating a semiconductor package according to some embodiments.

It is noted that aspects of the inventive concept described with respect to one embodiment, may be incorporated in a different embodiment although not specifically described relative thereto. That is, all embodiments and/or features of any embodiment can be combined in any way and/or combination. These and other objects and/or aspects of the present inventive concept are explained in detail in the specification set forth below.

Various example embodiments will now be described more fully hereinafter with reference to the accompanying drawings. Like reference numerals may refer to like elements throughout this application.

Figure 2:
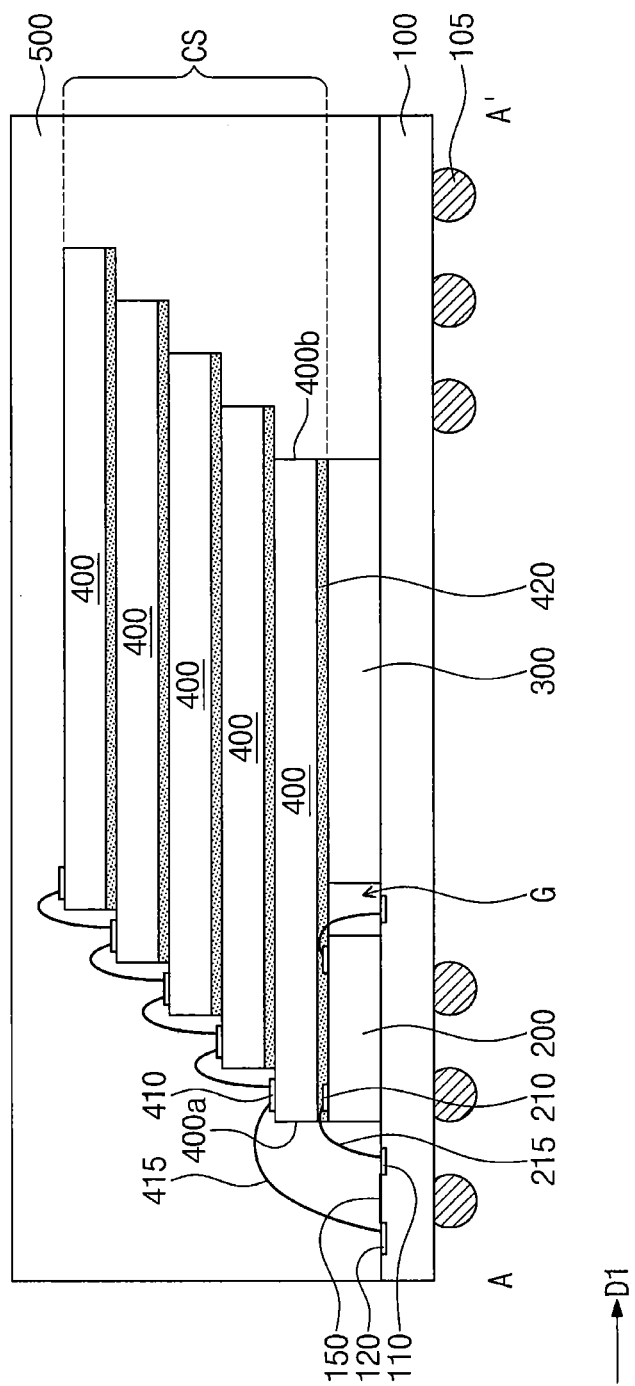
FIG. 2 is a cross-sectional view illustrating a semiconductor package according to some embodiments.
Figure 3:
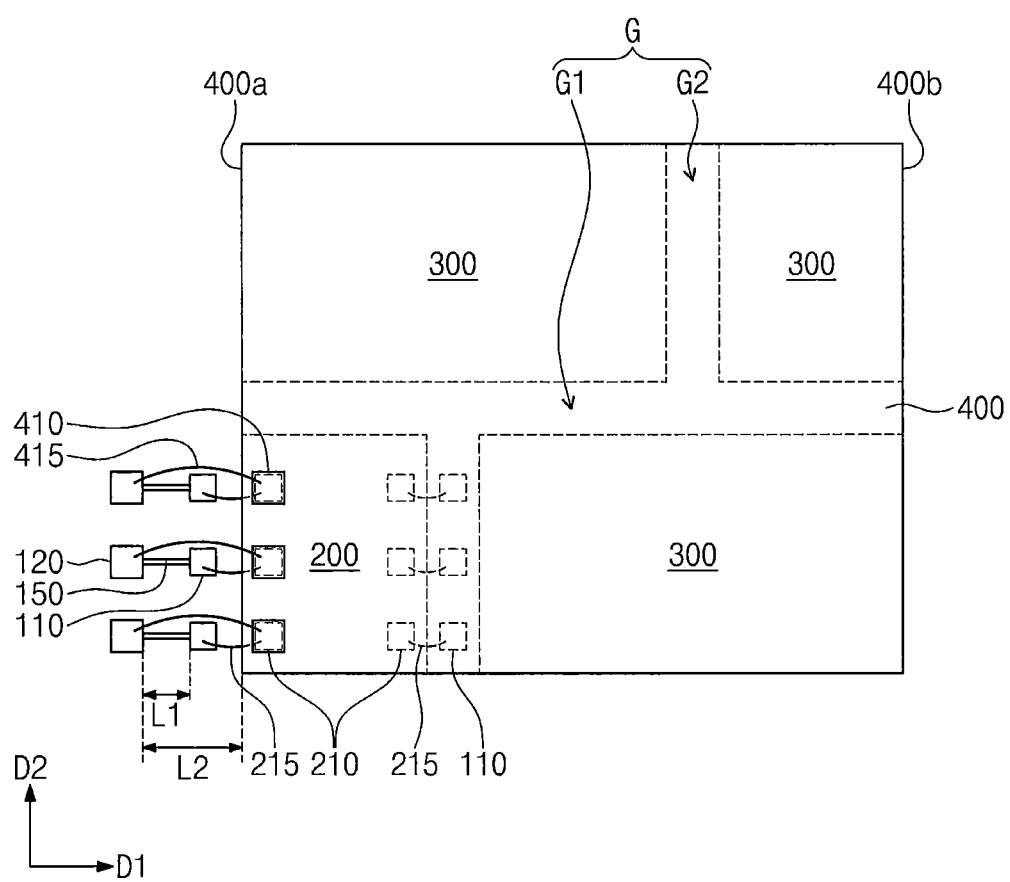
FIG. 3 is a view illustrating arrangement of a first semiconductor chip and spacers according to some embodiments.
Figure 4:
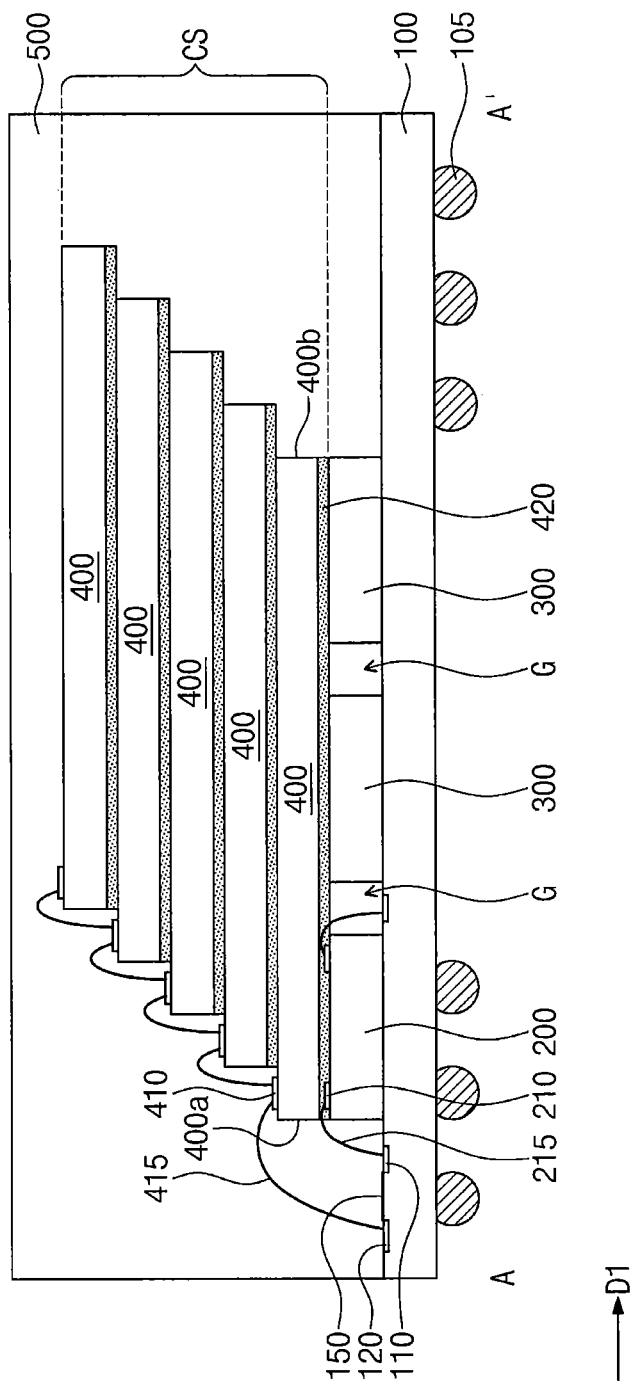
FIG. 4 is a cross-sectional view illustrating a semiconductor package according to some embodiments.
Figure 5:
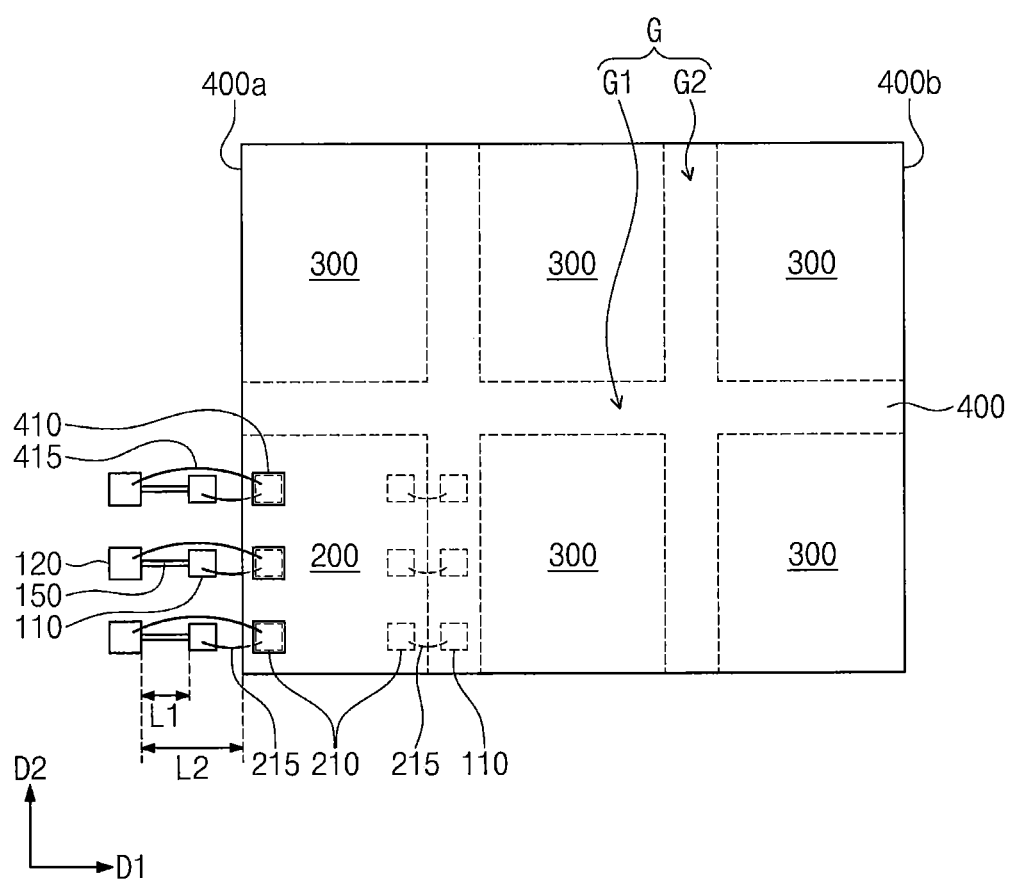
FIG. 5 is a view illustrating arrangement of a first semiconductor chip and spacers according to some embodiments.

FIG. 1 is a plan view illustrating a semiconductor package according to some embodiments. FIG. 2 is a cross-sectional view taken along line A-A' of FIG. 1, illustrating a semiconductor package according to some embodiments. FIG. 3 is a view illustrating arrangement of a first semiconductor chip and spacers according to some embodiments. FIG. 4 is a cross-sectional view taken along line A-A' of FIG. 1, illustrating a semiconductor package according to some embodiments. FIG. 5 is a view illustrating arrangement of a first semiconductor chip and spacers according to some embodiments.

Referring to FIGS. 1 to 3, a semiconductor package may include a substrate 100, a first semiconductor chip 200 and a plurality of spacers 300 which are disposed on the substrate 100, a chip stack CS on the first semiconductor chip 200 and on the spacers 300, and a molding layer 500 covering the chip stack CS.

The substrate 100 may be, for example, a printed circuit substrate including a signal pattern on an upper surface thereof. The signal pattern may include first and second signal pads 110 and 120 and a first conductive line 150. The substrate 100 may have a stack structure in which insulating layers and wiring layers are alternately sacked. An outer terminal 105 may be disposed on a lower surface of the substrate 100. The outer terminal 105 may include a solder ball or a solder pad. The semiconductor package may be a ball grid array (BGA) package, a fine ball-grid array (FBGA) package, or a land grid array (LGA) package according to a type of the outer terminal 105.

The chip stack CS may be disposed on the substrate 100. The chip stack CS may include a plurality of second semiconductor chips 400 that are stacked on the substrate 100. The second semiconductor chips 400 may be memory chips. A lowermost one of the second semiconductor chips 400 may have first and second sides 400a and 400b that are opposite to each other in a first direction D1. The chips stack CS may have an offset stack structure. For example, the second semiconductor chips 400 may be stacked in cascade form (e.g., in a stepped shape tilted in a reverse direction of the first direction D1). The second semiconductor chips 400 may be connected to each other by a second connection wire 415, which may include one or more wire segments. An adhesion layer 420 may be disposed between each of the second semiconductor chips 400. As the second semiconductor chips 400 are stacked in cascade form, portions of upper surfaces of the second semiconductor chips 400 may be exposed. The exposed upper surface of each of the second semiconductor chips 400 may be an active surface. A second chip pad 410 that is in contact with the second connection wire 415 may be disposed on the upper surface of each of the second semiconductor chips 400.

The second semiconductor chips 400 may be wire-bonded to the substrate 100 through the second connection wire 415. The second connection wire 415 may electrically connect the second chip pad 410 on one or more of the second semiconductor chips 400 and the second signal pad 120 of the substrate 100. The second signal pad 120 may be spaced apart from the chip stack CS (e.g., from the first side 400a of the lowermost second semiconductor chip 400) in the reverse direction of the first direction D1.

The first semiconductor chip 200 may be disposed on the substrate 100. The first semiconductor chip 200 may be disposed between the substrate 100 and the chip stack CS. In plan view, the first semiconductor chip 200 may be disposed in the reverse direction of the first direction D1 with respect to the center of the lowermost second semiconductor chip 400. For example, the first semiconductor chip 200 may be disposed adjacent to the first side 400a of the lowermost second semiconductor chip 400. The first semiconductor chip 200 may be disposed adjacent to the second signal pad 120 of the substrate 100. A side of the first semiconductor chip 200 may be aligned with the first side 400a of the lowermost second semiconductor chip 400. However, the inventive concepts are not limited thereto. For example, the side of the first semiconductor chip 200 may be protrude outward from the first side 400a of the lowermost second semiconductor chip 400 or be under the lowermost second semiconductor chip 400. In plan view, the first semiconductor chip 200 may be disposed adjacent to a corner of the lowermost second semiconductor chip 400. The first semiconductor chip 200 may be a logic chip, such as a controller, for controlling the second semiconductor chips 400. An upper surface of the first semiconductor chip 200 may be an active surface. A first chip pad 210 may be disposed on the upper surface of the first semiconductor chip 200.

The first semiconductor chip 200 may be wire-bonded to the substrate 100 through the first connection wire 215. The first connection wire 215 may electrically connect the first chip pad 210 on the first semiconductor chip 200 and the first signal pad 110 of the substrate 100. The first signal pad 110 may be adjacent to the second signal pad 120. For example, the first signal pad 110 may be disposed spaced from the chip stack CS (e.g., from the first side 400a of the lowermost second semiconductor chip 400) in the reverse direction of the first direction D1. A first distance L1 between the first signal pad 110 and the second signal pad 120 may be less than a second distance L2 by which the second signal pad 120 is spaced from the first side 400a of the lowermost second semiconductor chip 400. In some embodiments, the first connection wire 215 may vertically overlap the second connection wire 415. The first signal pad 110 and the second signal pad 120 may be electrically connected via the first conductive line 150 of the substrate 100. The first signal pad 110 and the second signal pad 120 may receive and transmit the same electrical signal. The first semiconductor chip 200 and one or more of the second semiconductor chips 400 may be electrically connected through the first signal pad 110 and/or the second signal pad 120.

The first chip pad 210 may be disposed on the upper surface of the first semiconductor chip 200 along the side thereof adjacent to the first side 400a of the lowermost second semiconductor chip 400. The second chip pad 410 is disposed on the upper surface of the lowermost second semiconductor chip 400 adjacent to the first side 400a thereof. The first connection wire 215 and/or the second connection wire 415 may extend in the same direction (e.g., the reverse direction of the first direction D1) from the first chip pad 210 and the second chip pad 410, respectively. The first signal pad 110 and the second signal pad 120 may be arranged adjacent to each other such that the first conductive line 150 connecting the first signal pad 110 and the second signal pad 120 may be shortened. Therefore, an electrical path between the first semiconductor chip 200 and the second semiconductor chips 400 may be shortened, and thus, electrical characteristics of the semiconductor package may be improved. Improvements may include reduced signal propagation time, reduced loss of signal energy, less capacitive effects of the signal wires, etc.

The spacers 300 may be disposed on the substrate 100. The spacers 300 may be disposed between the substrate 100 and the chip stack CS. The spacers 300 may be spaced from the first semiconductor chip 200. The spacers 300 may support the chip stack CS. The spacers 300 may include, for example, a dummy chip or a semiconductor substrate.

Referring to FIG. 3, the first semiconductor chip 200 and the spacers 300 may be disposed symmetrically with respect to the center of the lowermost second semiconductor chip 400. For example, in plan view, one of the spacers 300 may be disposed spaced from the center of the lowermost second semiconductor chip 400 in the first direction D1 and adjacent to the second side 400b of the lowermost second semiconductor chip 400. Another of the spacers 300 may be disposed adjacent to one corner of the lowermost second semiconductor chip 400 that is diagonally opposite to another corner thereof, that is adjacent to the first semiconductor chip 200. The other of the spacers 300 may be disposed in an extra space between the substrate 100 and the chip stack CS and may be disposed adjacent to the other corner of the lowermost second semiconductor chip 400. For example, the one of the spacers 300 and the other of the spacers 300 may be substantially in symmetry with respect the center of the lowermost second semiconductor chip 400. In some embodiments, at least one of the spacers 300 may have substantially the same planar shape as the first semiconductor chip 200. The first semiconductor chip 200 and the one of the spacers 300 having substantially the same planar shape as the first semiconductor chip 200 may be disposed adjacent to two diagonally opposite corners, respectively, of the lowermost second semiconductor chip 400. The others of spacers 300 that are disposed adjacent to the other two diagonally opposite corners, respectively, of the lowermost second semiconductor chip 400 may have substantially the same shape. Therefore, a load of the chip stack CS may be evenly dispersed, and thus, the chip stack CS may be fixedly supported by the first semiconductor chip 200 and the spacers 300 without collapsing. In other words, the chip stack CS may be weight balanced for physical stability.

A gap G between the first semiconductor chip 200 and the spacers 300 may have a grid shape in plan view. The gap G may include a first line region G1 extending in the first direction D1 and a second line region G2 extending in a second direction D2 perpendicular to the first direction D1.

In some embodiments, referring to FIG. 5, the first semiconductor chip 200 and the spacers 300 may be arranged in a matrix or lattice form. The first semiconductor chip 200 and the spacers 300 may be arranged along the first direction D1 and the second direction D2. The first semiconductor chip 200 and the spacers 300 may be similar or the same in size and/or shape, as shown in FIGS. 4 and 5.

The molding layer 500 may be disposed to cover the chip stack CS and the upper surface of the substrate 100. The molding layer 500 may fill the gap G between the first semiconductor chip 200 and the spacers 300. For example, in a process for forming the semiconductor package, an insulating polymer material for forming the molding layer 500 may be injected into the gap G between the first semiconductor chip 200 and the spacers 300. The gap G may be a flow path through which the insulating polymer material is introduced between the substrate 100 and the chip stack CS. The molding layer 500 may include, for example, an epoxy molding compound (EMC). The molding layer 500 may surround the chip stack CS and/or the various elements such as the first semiconductor chip 200 and the spacers 300.

Since the gap G including the regions extending in the first direction D1 and the second direction D2 has a plurality of line shapes (e.g., the grid shape as illustrated in FIG. 5), a resistance to inflow of the insulating polymer material may be reduced such that a void in the gap G may be reduced or prevented.

Figure 6:
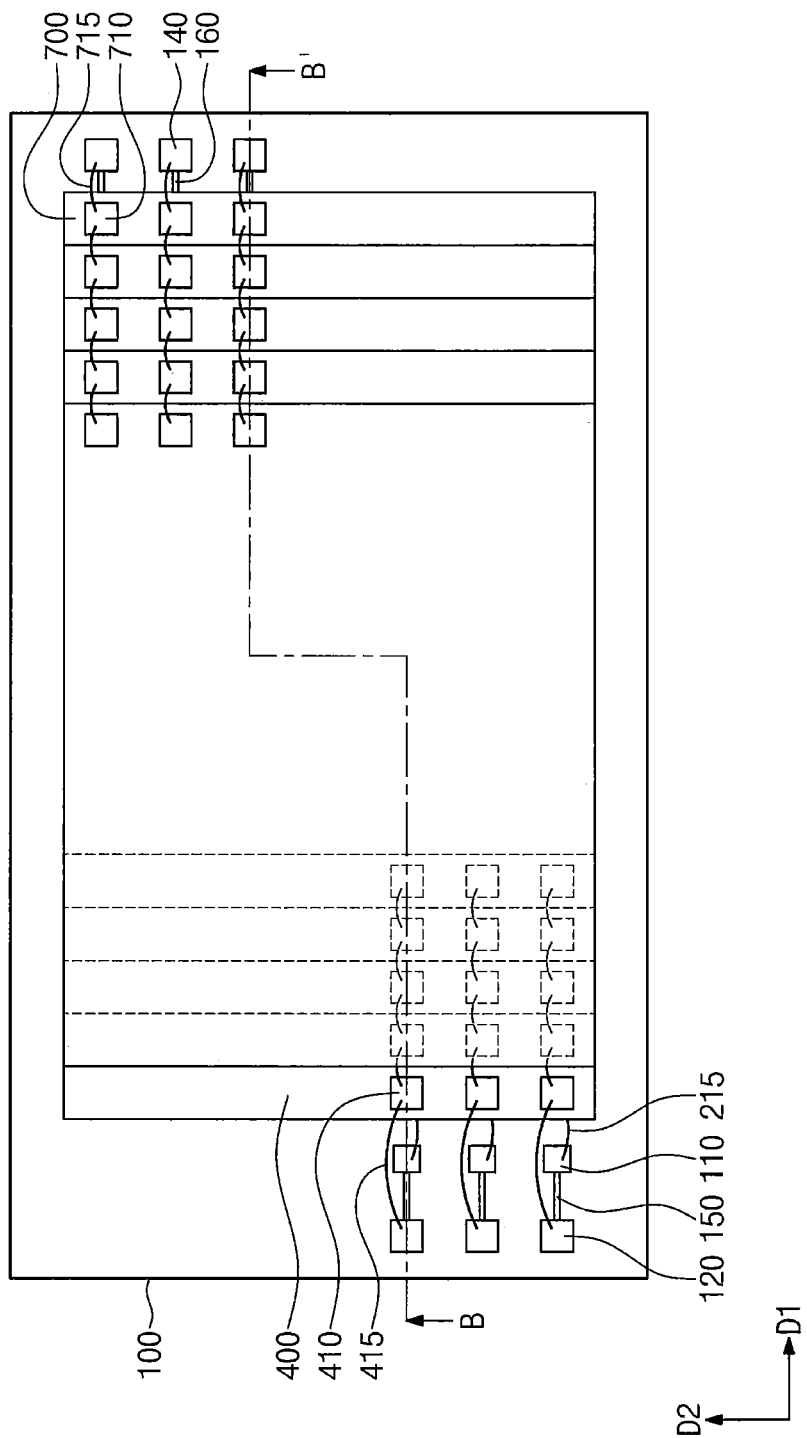
FIG. 6 is a plan view illustrating a semiconductor package according to some embodiments.
Figure 7:
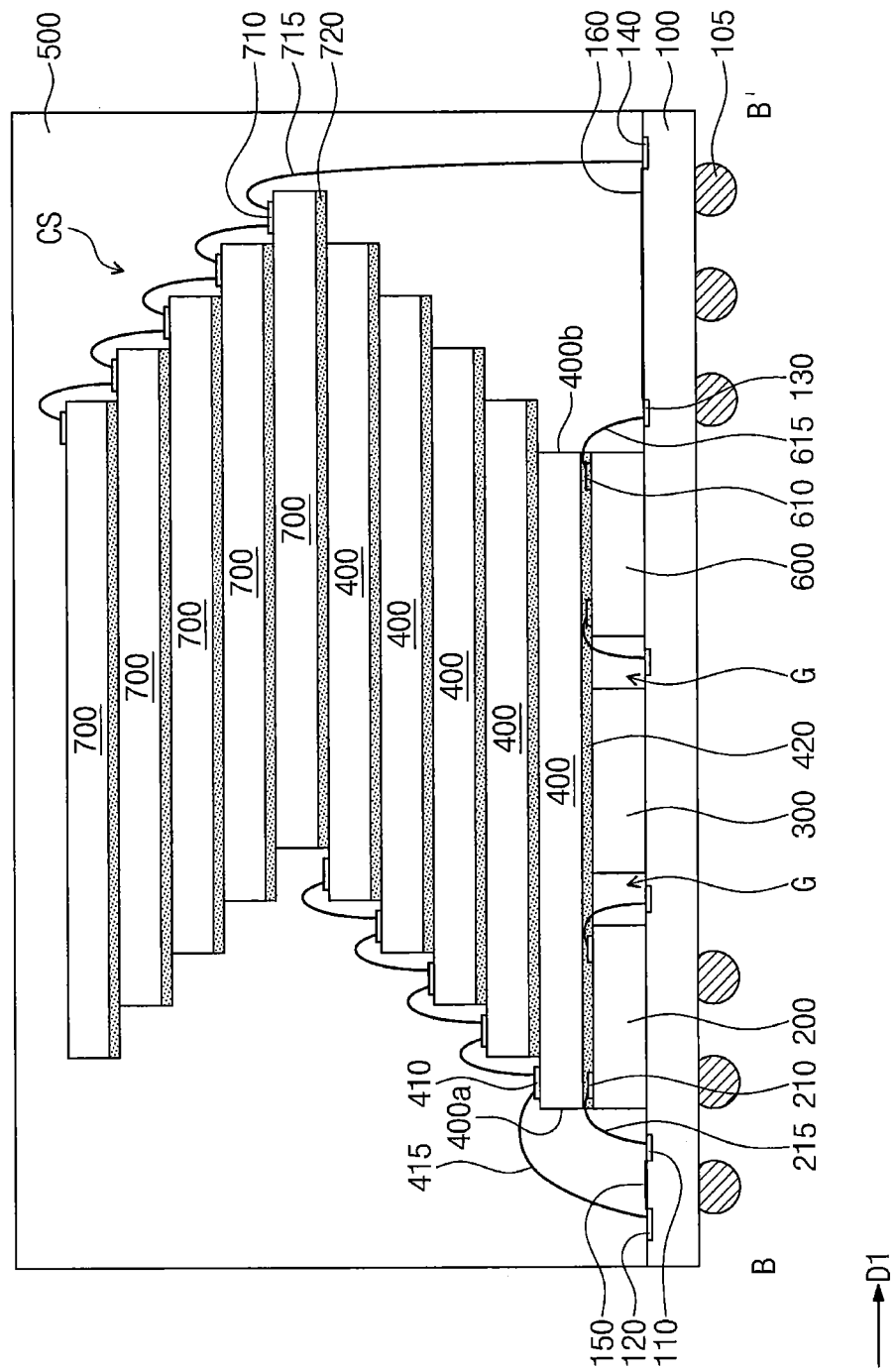
FIG. 7 is a cross-sectional view illustrating a semiconductor package according to some embodiments.
Figure 8:
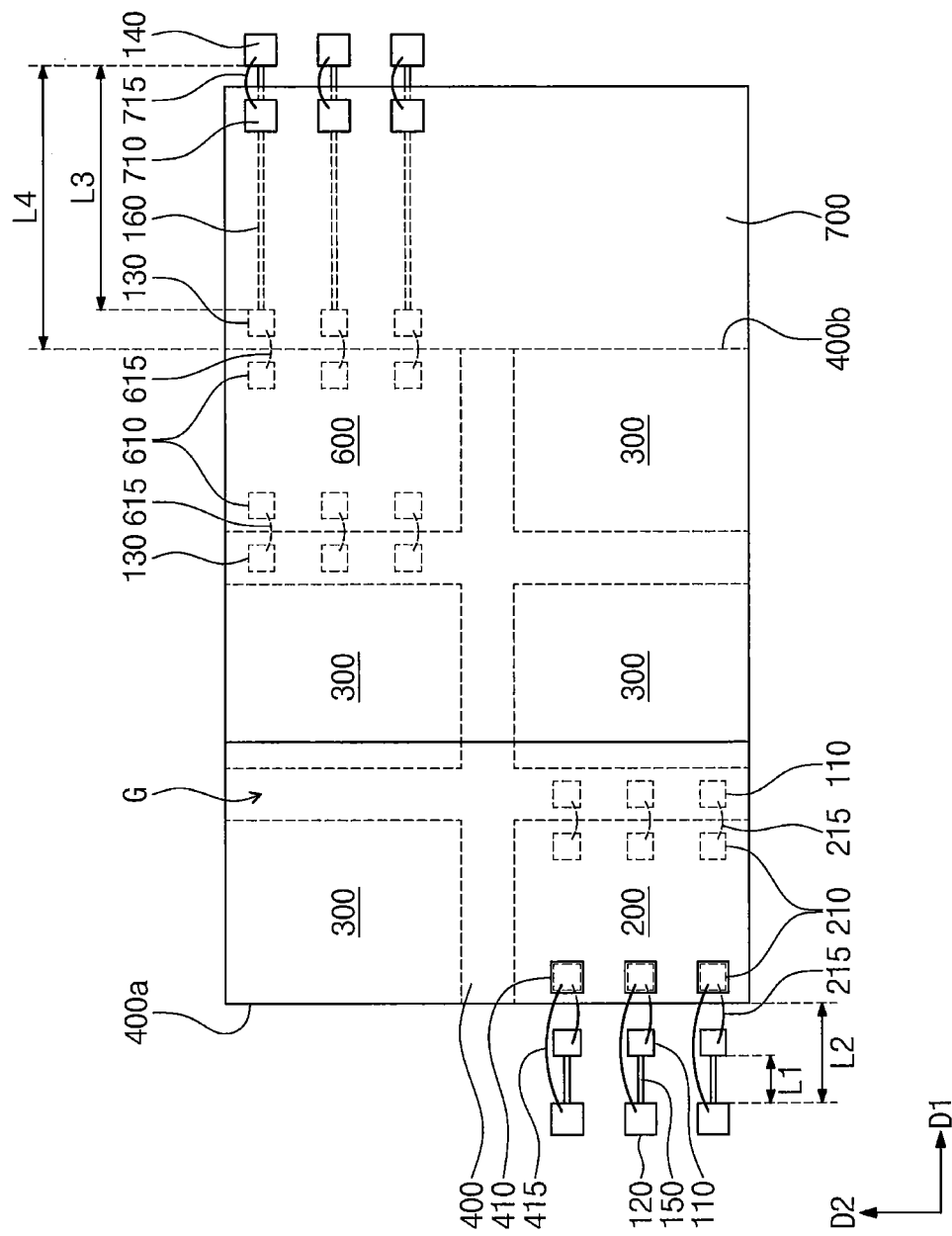
FIG. 8 is a view illustrating arrangement of a first semiconductor chip, a third semiconductor chip, and spacers according to some embodiments.

FIG. 6 is a plan view illustrating a semiconductor package according to example embodiments. FIG. 7 is a cross-sectional view taken along line B-B' of FIG. 6, illustrating a semiconductor package according to example embodiments. FIG. 8 is a view illustrating arrangement of a first semiconductor chip, a third semiconductor chip, and spacers according to example embodiments. The descriptions to the same elements as described in the aforementioned embodiments will be omitted or mentioned briefly.

Referring to FIGS. 6 to 8, the substrate 100 may be provided. The substrate 100 may include the signal pattern including the first and second signal pads 110 and 120, third and fourth signal pads 130 and 140, the first conductive line 150, and a second conductive line 160 that are disposed on the upper surface thereof. The outer terminal 105 may be disposed on the lower surface of the substrate 100.

The chip stack CS may be disposed on the substrate 100. The chip stack CS may include a plurality of the second semiconductor chips 400 and a plurality of fourth semiconductor chips 700. The second semiconductor chips 400 and/or the fourth semiconductor chips 700 may each be a memory chip.

The second semiconductor chips 400 may be stacked on the substrate 100. The lowermost second semiconductor chip 400 have the first and second sides 400a and 400b that are opposite to each other in the first direction D1. The second semiconductor chips 400 may form the offset stack structure in stepped shape tilted in the reverse direction of the first direction D1. The upper surfaces of the second semiconductor chips 400 may be respectively at least partially exposed and may be active regions. The second chip pad 410 may be disposed on the upper surface of each of the second semiconductor chips 400 to be connected through the second connection wire 415.

The second semiconductor chips 400 may be wire-bonded to the substrate 100 through the second connection wire 415. The second connection wire 415 may electrically connect the second chip pad 410 to the second signal pad 120 of the substrate 100 that is disposed spaced from the chip stack CS (e.g., from the first side 400a of the lowermost second semiconductor chip 400) in the reverse direction of the first direction D1.

The fourth semiconductor chips 700 may be stacked on an uppermost one of the second semiconductor chips 400. The fourth semiconductor chips 700 may form an offset stack structure in a stepped shape tilted in the first direction D1. The fourth semiconductor chips 700 may be connected to each other through a fourth connection wire 715 that includes one or more wire segments. Upper surfaces of the fourth semiconductor chips 700 may respectively be at least partially exposed and may be active surfaces. A fourth chip pad 710 may be disposed on the upper surface of one or more of the fourth semiconductor chips 700 to be contact with the fourth connection wire 715.

The fourth semiconductor chips 700 may be wire-bonded to the substrate 100 through the fourth connection wire 715. The fourth connection wire 715 may electrically connect the fourth chip pad 710 to the fourth signal pad 140 of the substrate 100 that is disposed spaced from the chip stack CS (e.g., from the second side 400b of the lowermost second semiconductor chip 400) in the first direction D1.

The first semiconductor chip 200 may be disposed between the chip stack CS and the substrate 100. Referring to FIG. 8, in plan view, the first semiconductor chip 200 may be disposed adjacent to one corner connecting to the first side 400a, of the lowermost second semiconductor chip 400. A side of the first semiconductor chip 200 may be aligned with the first side 400a of the lowermost second semiconductor chip 400. The first semiconductor chip 200 may be a logic chip. The upper surface of the first semiconductor chip 200 may be an active surface on which the first chip pad 210 is disposed.

The first semiconductor chip 200 may be wire-bonded to the substrate 100 through the first connection wire 215. The first connection wire 215 may connect the first chip pad 210 to the first signal pad 110 of the substrate 100. The first signal pad 110 may be disposed adjacent to the second signal pad 120. The first signal pad 110 and the second signal pad 120 may be electrically connected through the first conductive line 150 of the substrate 100. The first signal pad 110 and the second signal pad 120 may receive and/or transmit the same electrical signal. The first semiconductor chip 200 and the second semiconductor chips 400 may be electrically connected through the first signal pad 110 and/or the second signal pad 120.

The third semiconductor chip 600 may be disposed between the substrate 100 and the stack chip CS. Referring to FIG. 8, in plan view, the third semiconductor chip 600 may be disposed symmetrical to the first semiconductor chip 200 with respect to the center of the lowermost second semiconductor chip 400. For example, in plan view, the third semiconductor chip 600 may be spaced apart from the center of the lowermost second semiconductor chip 400 in the first direction D1 and adjacent to the second side 400b of the lowermost second semiconductor chip 400. The third semiconductor chip 600 may be disposed adjacent to another corner connecting to the second side 400*b*, of the lowermost second semiconductor chip 400. The third semiconductor chip 600 may be adjacent to the another corner of the lowermost second semiconductor chip 400 that is diagonally opposite to the one corner of the lowermost second semiconductor chip 400 adjacent to the first semiconductor chip 200. A side of the third semiconductor chip 600 may be aligned with the second side 400*b* of the lowermost second semiconductor chip 400. However, the inventive concepts are not limited thereto. The third semiconductor chip 600 may be a logic chip, such as controller, for controlling the fourth semiconductor chips 700. An upper surface of the third semiconductor chip 600 may be an active surface. A third chip pad 610 may be disposed on the upper surface of the third semiconductor chip 600.

The third semiconductor chip 600 may be wire-bonded to the substrate 100 through a third connection wire 615. The third connection wire 615 may electrically connect the third chip pad 610 to the third signal pad 130 of the substrate 100. The third signal pad 130 may be disposed adjacent to the fourth signal pad 140. For example, the third signal pad 130 may be spaced apart from the chip stack CS (e.g., from the second side 400*b* of the lowermost second semiconductor chip 400) in the first direction D1. A third distance L3 between the third signal pad 130 and the fourth signal pad 140 may be less than a fourth distance L4 by which the fourth signal pad 140 is spaced from the second side 400*b* of the lowermost second semiconductor chip 400. In some embodiments, the third connection wire 615 and the fourth connection wire 715 may vertically overlap each other. The third signal pad 130 and the fourth signal pad 140 may be electrically connected through the second conductive line 160 of the substrate 100. The third signal pad 130 and the fourth signal pad 140 may receive and transmit the same electrical signal. The third semiconductor chip 600 and the fourth semiconductor chips 700 may be electrically connected through the third signal pad 130 and the fourth signal pad 140.

Since the first signal pad 110 and the second signal pad 120 are adjacent to each other and the third signal pad 130 and the fourth signal pad 140 are adjacent to each other, the first conductive line 150 connecting the first signal pad 110 and the second signal pad 120 and the second conductive line 160 connecting the third signal pad 130 and the fourth signal pad 140 may respectively be shortened. Thus, an electrical path between the first semiconductor chip 200 and the second semiconductor chips 400 and an electrical path between the third semiconductor chip 600 and one or more of the fourth semiconductor chips 700 may respectively be shortened such that electrical characteristics of the semiconductor package may be improved. Improved electrical characteristics may include reduced signal propagation delay, improved signal shaping, less capacitive loading caused by wiring loads, and/or reduced signal transition times.

The spacers 300 may be disposed between the substrate 100 and the chip stack CS. The spacers 300 may be disposed spaced from the first semiconductor chip 200 and the third semiconductor chip 600. The spacers 300 may be disposed in an extra space between the substrate 100 and the chip stack CS (that is unoccupied by the first semiconductor chip 200 and the third semiconductor chip 600). The spacers 300 may be disposed in symmetry with respect to the center of the lowermost second semiconductor chip 400. The spacers 300 may support the chip stack CS. The first semiconductor chip 200, the third semiconductor chip 600, and the spacers 300 may be disposed in symmetry with respect to the center of the lowermost second semiconductor chip 400, and thus, a load of the chip stack CS may be evenly dispersed such that the chip stack CS may be fixedly supported by the first semiconductor chip 200, the third semiconductor chip 600, and the spacers 300 without collapsing.

The molding layer 500 may be disposed to cover and/or surround the chip stack CS and the upper surface of the substrate 100. The molding layer 500 may fill the gap G between the first semiconductor chip 200, the third semiconductor chip 600, and the spacers 300.

Figure 9:
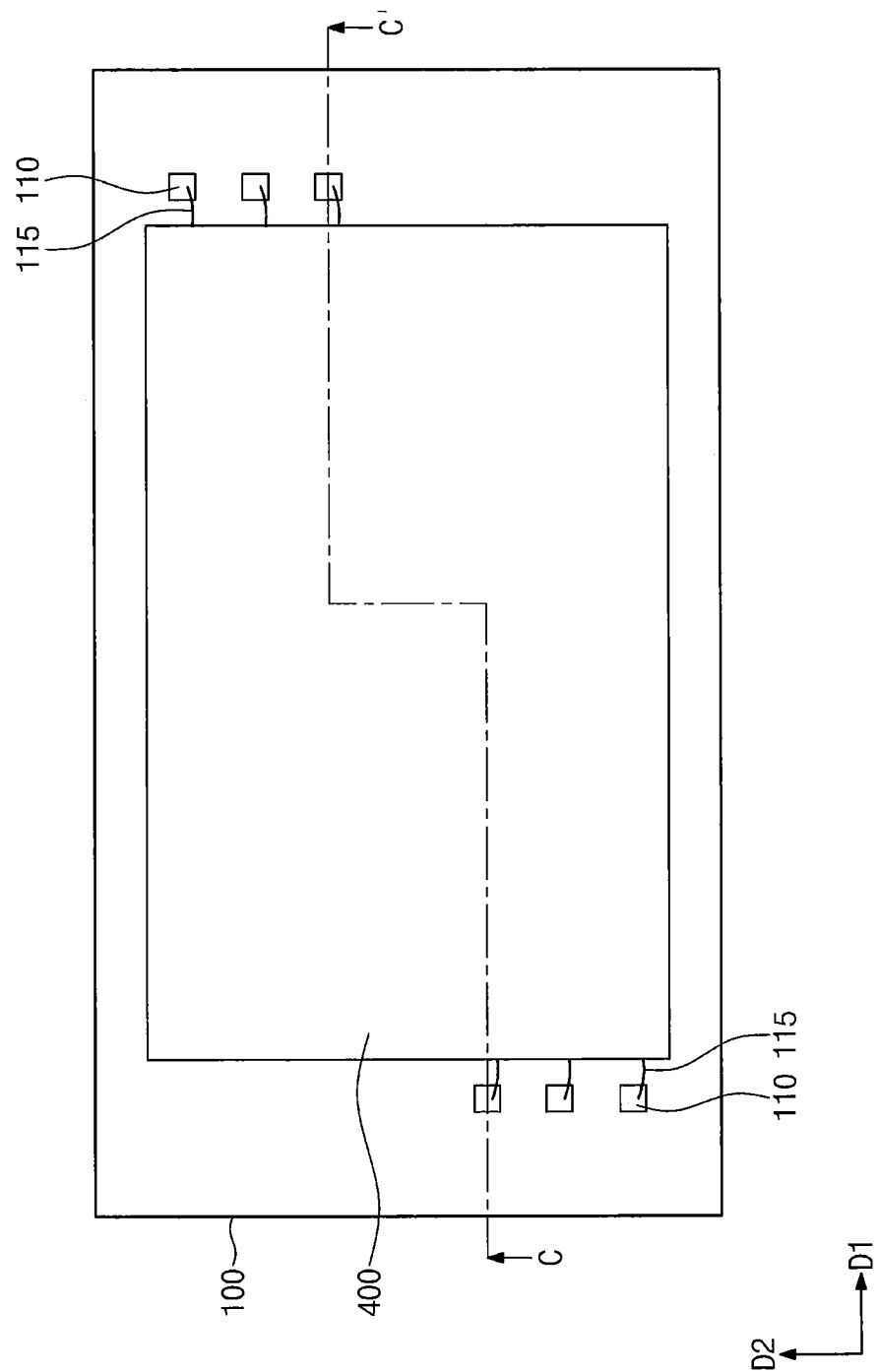
FIG. 9 is a plan view illustrating a semiconductor package according to some embodiments.
Figure 10:
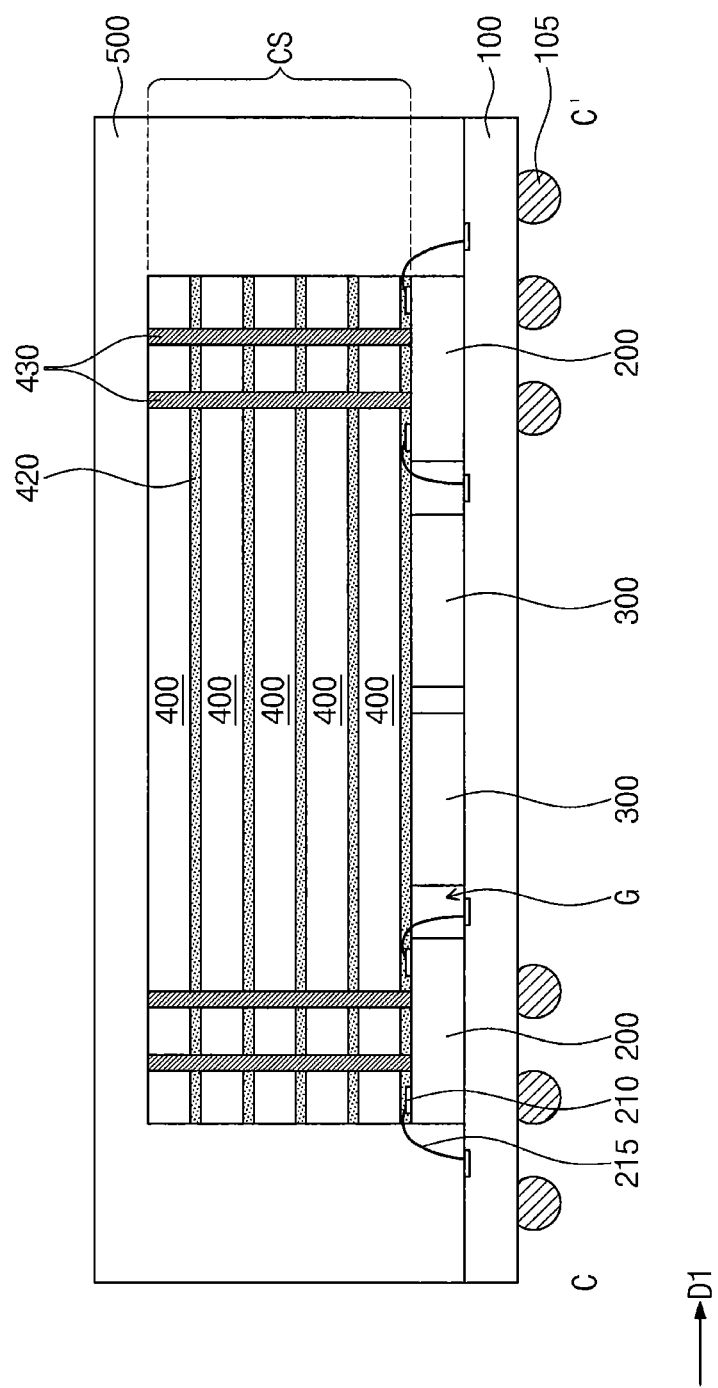
FIG. 10 is a cross-sectional view illustrating a semiconductor package according to some embodiments.
Figure 11:
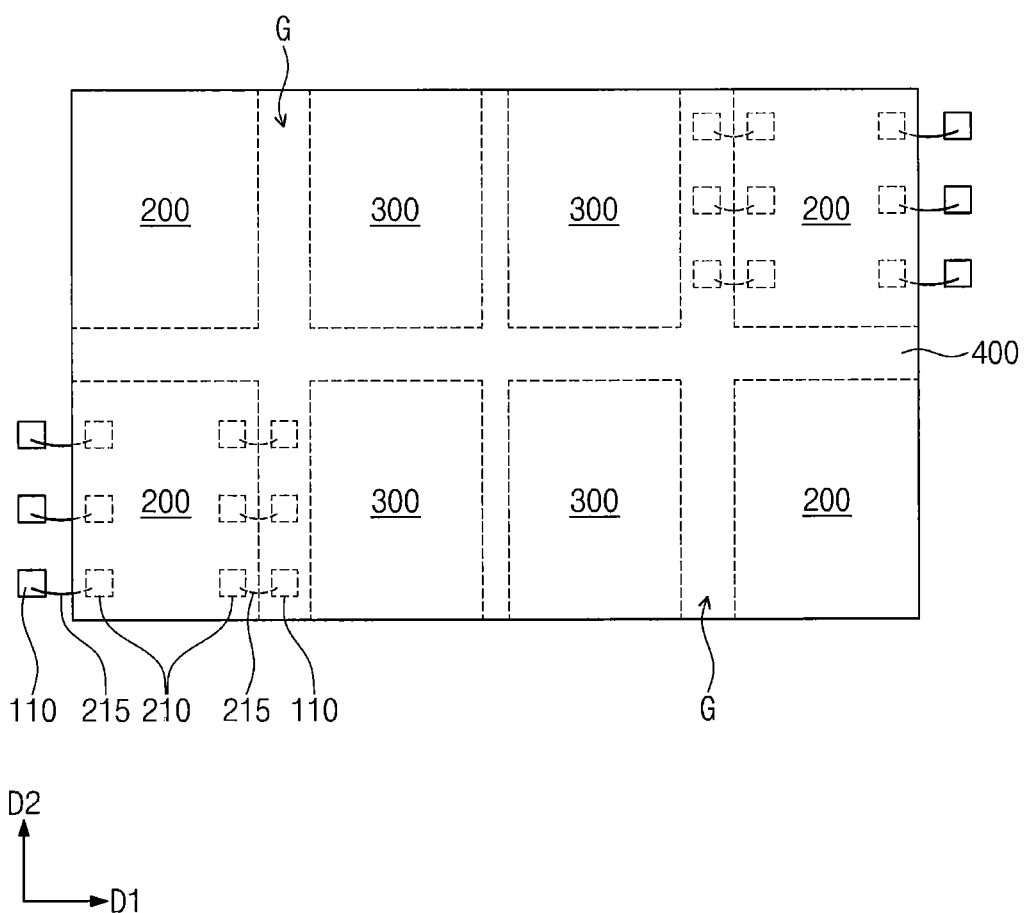
FIG. 11 is a view illustrating arrangement of first semiconductor chips and spacers according to some embodiments.

FIG. 9 is a plan view illustrating a semiconductor package according to example embodiments. FIG. 10 is a cross-sectional view taken along line C-C' of FIG. 9, illustrating a semiconductor package, according to example embodiments. FIG. 11 is a view illustrating arrangement of first semiconductor chips and spacers according to example embodiments. The descriptions to the same elements as described in the aforementioned embodiments will be omitted or mentioned briefly.

Referring to FIGS. 9 to 11, the substrate 100 including the signal pattern on an upper surface thereof may be provided. The substrate 100 may be, for example, a printed circuit board. The outer terminal 105 may be disposed on the lower surface of the substrate 100.

The chip stack CS may be disposed on the substrate 100. The chip stack CS may include a plurality of the second semiconductor chips 400 stacked on the substrate 100. The second semiconductor chips 400 may be memory chips. The stack CS may have a vertical stack structure in which the second semiconductor chips 400 are sequentially stacked. For example, in plan view, the second semiconductor chips 400 may substantially entirely overlap each other. The second semiconductor chips 400 may be electrically connected through a through-silicon-via (TSV) 430 passing therethrough. The TSV 430 may electrically connect one or more of the second semiconductor chips 400 to one another.

A plurality of first semiconductor chips 200 may be disposed between the substrate 100 and the chip stack CS. In plan view, the first semiconductor chips 200 may overlap the TSV 430. The first semiconductor chips 200 may be logic chips. An upper surface of each of the first semiconductor chips 200 may be an active surface. One or more of the first semiconductor chips 200 may be electrically connected to one or more of the second semiconductor chips 400 through the TSV 430 contacting the upper surfaces of the first semiconductor chips 200.

The first semiconductor chips 200 may be wire-bonded to the substrate 100 through the first connection wire 215. The first connection wire 215 may connect the first chip pad 210 on the upper surface of one or more of the first semiconductor chips 200 to the first signal pad 110 of the substrate 100.

The spacers 300 may be disposed between the substrate 100 and the chip stack CS. The spacers 300 may be disposed spaced from the first semiconductor chips 200. The spacers 300 may be disposed in an extra space between the substrate 100 and the second semiconductor chips 400 (that is unoccupied by the first semiconductor chips 200).

The spacers 300 may be disposed in symmetry with respect to the center of the lowermost second semiconductor chip 400. The spacers 300 may support the chip stack CS. The first semiconductor chips 200 and the spacers 300 may be disposed in symmetry with respect to the center of the lowermost second semiconductor chip 400, and thus, a load of the chip stack CS may be evenly dispersed on the first semiconductor chip 200 and the spacers 300 such that the chip stack CS may be fixedly supported by the first semiconductor chips 200 and the spacers 300 without collapsing.

The molding layer 500 may be disposed to cover the chip stack CS and the upper surface of the substrate 100. The molding layer 500 may fill the gap G between the first semiconductor chips 200 and the spacers 300.

While the present inventive concepts have been shown and described with reference to example embodiments thereof, it will be understood by those of ordinary skill in the art that various changes in form and details may be made thereto without departing from the spirit and scope of the present inventive concepts as set forth by the following claims.

What is claimed is:

1. A semiconductor package comprising:
   a substrate comprising a signal pattern on an upper surface thereof;
   a chip stack on the upper surface of the substrate; and
   a first semiconductor chip and plurality of spacers that are between the substrate and the chip stack,
   wherein the first semiconductor chip and the spacers are spaced apart from each other,
   wherein the chip stack comprises second semiconductor chips at a lowermost portion of the chip stack,
   wherein a second semiconductor chip of the second semiconductor chips has a first side and a second side that are opposite to each other in a first direction stacked on the substrate,
   wherein one of the plurality of spacers and the first semiconductor chip are respectively adjacent to opposite ones of the corners of the second semiconductor chip, in plan view, and
   wherein the one of the spacers has a same planar shape as the first semiconductor chip.

2. The semiconductor package according to claim 1, wherein a gap between the spacers and the first semiconductor chip comprises a first line region extending in the first direction and a second line region extending in a second direction perpendicular to the first direction.

3. The semiconductor package according to claim 2, further comprising:
   a molding layer on the chip stack and filling the gap.

4. The semiconductor package according to claim 1,
   wherein a side of the first semiconductor chip is aligned with the first side of the second semiconductor chip, and
   wherein a side of the one of the spacers is aligned with the second side of the second semiconductor chip.

5. The semiconductor package according to claim 1, wherein other ones of the spacers are respectively adjacent to opposite other ones of the corners of the second semiconductor chip, in plan view.

6. The semiconductor package according to claim 1,
   wherein the chip stack has an offset stack structure in a stepped shape tilted in a second direction that is opposite to the first direction.

7. The semiconductor package according to claim 6,
   wherein the chip stack has the offset stack structure in which the second semiconductor chips are stacked on each other, and
   wherein at least one of the second semiconductor chips of the chip stack does not overlap the first semiconductor chip in the plan view.

8. The semiconductor package according to claim 1, wherein the signal pattern comprises:
   a first signal pad spaced apart from the chip stack in a second direction perpendicular to the first direction and electrically connected to the first semiconductor chip;
   a second signal pad spaced apart from the chip stack in the second direction and electrically connected to the second semiconductor chips; and
   a conductive line connecting the first signal pad and the second signal pad.

9. The semiconductor package according to claim 8, wherein a first distance between the first signal pad and the second signal pad is less than a second distance between the second signal pad and the first side of the second semiconductor chip.

10. The semiconductor package according to claim 8, wherein a first distance between the first signal pad and the first semiconductor chip is same as a third distance between the first signal pad and the second side of the second semiconductor chip.

11. The semiconductor package according to claim 1,
    wherein the chip stack has a vertical stack structure in which the second semiconductor chips substantially overlap each other entirely, and
    wherein the second semiconductor chips are electrically connected to the first semiconductor chip through a through-silicon-via passing through the chip stack.

12. The semiconductor package according to claim 1,
    wherein at least one of the second semiconductor chips of the chip stack does not overlap the first semiconductor chip in the plan view.

* * * * *